United States Patent [19]
Schuetz et al.

[11] Patent Number: 5,521,388
[45] Date of Patent: May 28, 1996

[54] SELECTIVE CROSSLINK SCANNING SYSTEM

[75] Inventors: Marlin N. Schuetz, Raleigh; Patrick W. Wallace, Chapel Hill, both of N.C.

[73] Assignee: Raychem Corporation, Menlo Park, Calif.

[21] Appl. No.: 475,258

[22] Filed: Jun. 7, 1995

[51] Int. Cl.$^6$ .................................................. H01J 3/26
[52] U.S. Cl. ............................. 250/396 ML; 250/396 R; 250/492.3
[58] Field of Search ................. 250/346 ML, 396 R, 250/310, 311, 492.22, 492.3

[56] References Cited

U.S. PATENT DOCUMENTS 5,107,124  4/1992  Winkler .................... 250/396 R

Primary Examiner—Jack I. Berman
Assistant Examiner—Kiet T. Nguyen
Attorney, Agent, or Firm—Herbert G. Burkard; William D. Zahrt, II

[57] ABSTRACT

A scanning system (25) for controlling a scanning servo (28,30) includes a scanning signal generator (50) which generates (51) a series of square wave scan signals, a pulse signal generator which generates (52) a pattern of pulses having short durations relative to the scan signal from the first generator, the generators being synchronized, and the scan signals and pulses then being separately applied to the scanner servo (30) to control it such that the resulting scanning behavior of the servo corresponds to the scan signals modified by the pattern of pulses.

22 Claims, 8 Drawing Sheets

$$I = \frac{V}{R}(1 - e^{-\frac{t}{T_L}})$$

$$I = \frac{V}{R} e^{-\frac{t}{T_L}}$$

$(T_L = L/R)$

SELECTIVE CROSSLINK SCANNING SYSTEM

BACKGROUND OF THE INVENTION

The present invention relates to scanning control systems, and more particularly to improved methods and apparatus for economically and efficiently controlling electron beam scanning in industrial radiation processing to controllably tailor the exposure of the target material to the electron beam.

Electron beam scanning is typically done utilizing an electromagnet which deflects the electron beam back and forth across the target material, usually orthogonally to the direction of travel of both the beam and the target material. The target material is usually moved continuously through a "window" area where the electron beam exits from the accelerator and strikes the target material. The angle of sweep of the electron beam is proportional to the current in the coil of the electromagnet. This current is supplied by an electronic scanning system, so that, in a sense, the scanning electromagnet can be seen as a servomechanism (servo) whose scanning behavior is a result of the scan control signals applied to it by the electronic scanning system.

A typical objective in such industrial electron beam scanning is to achieve uniformity of the electron beam dosage across the target material or product, which means that the electron beam should be scanned linearly across the target material. This is accomplished in many commercial implementations by applying a square wave voltage source to the inductance of the electromagnet such that the full sweep across the target is achieved in the more rapidly changing, nearly linear early portion of the function representing the current of the inductor as a time-based function of the applied square wave voltage.

Not surprisingly, this approach is not always ideal. Scan uniformity (beam dose uniformity) can still be poor (e.g., from parasitic effects) and may lead to product and use variations. Also, certain situations call for non-uniform processing—i.e., for exposing specific regions of the target material to higher beam doses than other regions. For example, a particular sheet material might have its properties significantly enhanced if the edge regions thereof received a significantly greater electron beam treatment than the central region. Both of these situations can be resolved with mechanical masking, but that is often both impractical and wasteful of the electron beam energy. Another solution is to modulate the scan signal from the scanning signal generator so that the servo (scanning magnet) causes the electron beam to exhibit the desired non-linear scanning behavior. However, such electronic circuits are not only challenging to design, but require final power amplifiers whose outputs can be modulated accordingly. This results in unnecessary complexity and expense which is all the more aggravated as the power requirements for the scanning system increase for controlling higher energy beaming systems.

A need therefore remains for improved, uncomplicated, efficient, versatile, and economical methods and apparatus for controlling the scanning or sweeping of the electron beam during exposure of target materials to electron beam radiation. Preferably such improved methods and apparatus will be directly usable and compatible with existing scanner servomechanisms while providing a high degree of easily customizable differential exposure control.

SUMMARY OF THE INVENTION

Briefly, the present invention meets the above needs and purposes with a new and improved scanning system and method for controlling a scanner servo such as used to sweep an electron beam during industrial electron beam scanning of selected target materials.

In accordance with the present invention, the scanning system (electronics) for controlling the scanning servo (scanning electromagnet) employs a conventional cycling square wave power amplifier connected to one input of the scanner servomechanism (for example, one terminal of the coil of a scanning electromagnet). A conventional, highly efficient power amplifier can therefore be employed, such as, for example, one which simply switches full on or full off and does not need to have intermediate, modulated amplitude capabilities. Then, to provide the differential control, a second electrical circuit in the scanning system is operated substantially synchronously with the scanning signal generator portion thereof. The second circuit is a pulse signal generator which generates a pre-selected pattern of pulses which are applied to another portion of the scanner servo (for example, the other terminal of the scanning electromagnet coil) so that the scanner servo itself physically combines the scan signal and the pulses to produce a resulting scanning behavior of the servo that corresponds to the initial scan signals but modified by this pattern of pulses from the pulse signal generator. Thus, by appropriately selecting the number, timing, duration, and/or amplitudes of the applied pulses, a very sophisticated modification of the resulting scanning behavior of the servo can be achieved with inexpensive and straightforward digital techniques. In a preferred embodiment, in fact, the pulse signal generator can also be operated as a digital switch, from full off to full on states, and if needed or desired, several can be provided, so that the complexities and costs can be minimized compared with, for example, high power linear amplifiers designed to deliver a single, complex, modulated scanning signal.

It is therefore an object of the present invention to provide new and improved methods and apparatus for controlling a scanner servo, and more particularly such methods and apparatus which include a scanning signal generator for generating a predetermined series of scan signals, a pulse signal generator for generating a predetermined pattern of pulses having pulse durations substantially less than the duration of a scan signal from the scanning signal generator, means for substantially synchronizing the pulse signal generator with the scanning signal generator, and means for applying the scan signals and separately applying the pulses to such a scanner servo to control it such that the resulting scanning behavior of the servo corresponds to the scan signals modified by the pattern of pulses; in which the scanning signal generator may generate substantially square wave scan signals; in which the scanning signal generator may generate a substantially cyclical series of scan signals; in which the pulse signal generator may include means for controlling at least one of the duration, amplitude, number, and/or timing of the pulses; in which the pulse signal generator may include a bit pulse generator means for controlling the pulses; which may include a scanner servo for controlling the sweeping of an electron beam during electron beam scanning; in which such a scanner servo may be controlled by the means for applying the scan signals and the pulses to control the electron beam sweeping in response thereto; in which such a scanner servo may include a scanning electromagnet; in which the means for applying may be connected to the coil means of such a scanning electromagnet to apply the scan signals to one portion of the coil means and to apply the pulses to another portion of the coil means, such that the scanning electromagnet physically combines the scan signals and the pulses to yield the resulting scanning behavior; in which the means for applying may be connected to opposite coil terminals of such a scanning electromagnet to apply the scan signals to one of the terminals and the pulses to the other; in which the pulse signal generator may include scan dose control means for the electron beam scanning to provide controllable differential beam dosage as a function of the scan signals modified by the pulses; in which the scan dose control means may include means for generating a predetermined differential beam exposure from a substantially constant beam current; and to accomplish the above objects and purposes in an inexpensive, uncomplicated, durable, versatile, and reliable method and apparatus, inexpensive to manufacture, and readily suited to the widest possible utilization in scanning systems for controlling scanner servomechanisms such as utilized in electron beam scanning.

These and other objects and advantages of the invention will be apparent from the following description, the accompanying drawings, and the appended claims.

DESCRIPTION OF THE PREFERRED EMBODIMENTS

Figure 1:
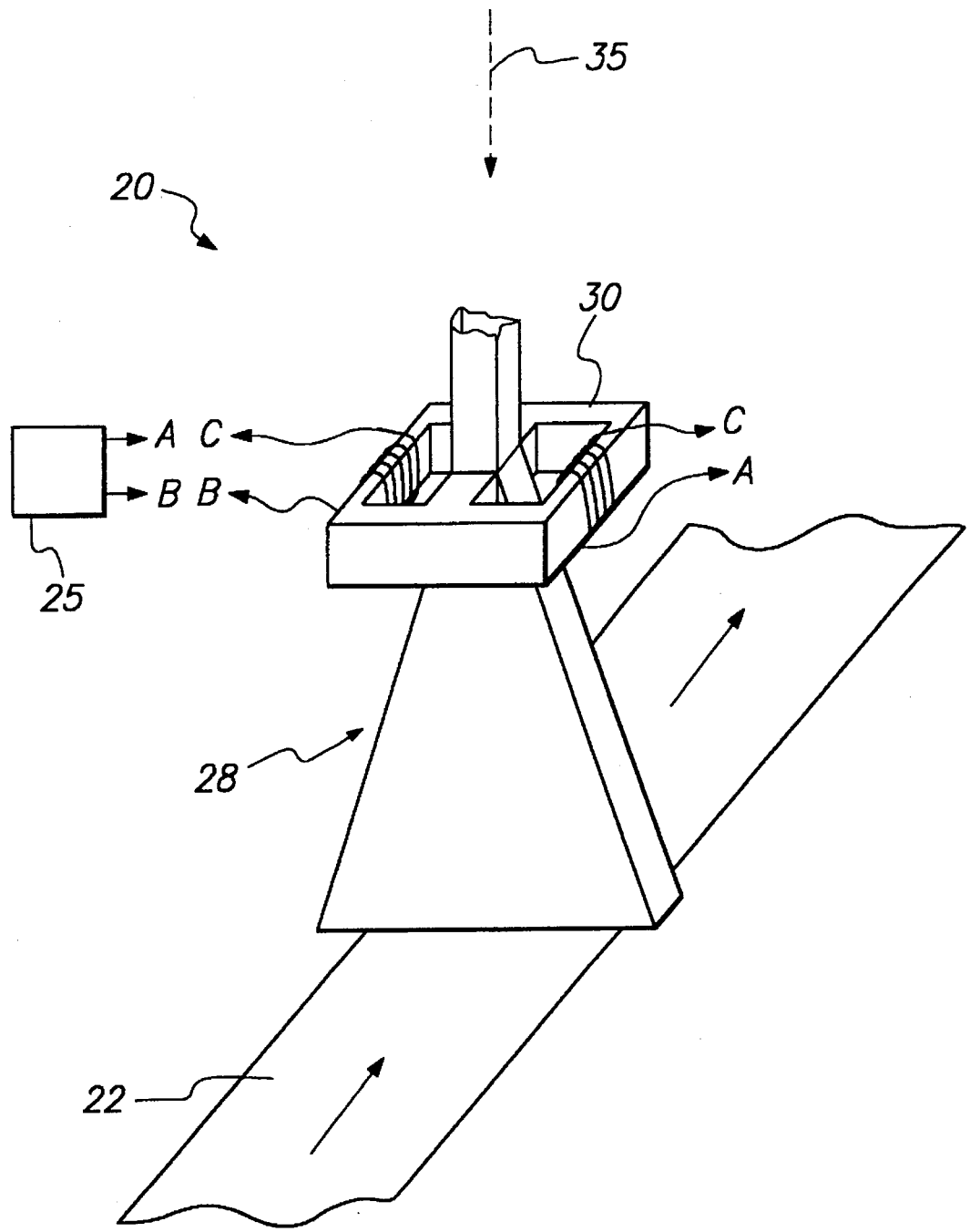
FIG. 1 is a somewhat figurative illustration showing an electron beam radiation processing machine incorporating a scanning system in accordance with the present invention.

With reference to the drawings, the new and improved scanning system for controlling a scanner servo, and the method therefor according to the present invention, will now be described. FIG. 1 figuratively depicts a typical electron beam scanning machine 20 such as is commonly used in industrial applications, for example, for cross-linking polymeric sheet materials 22 to modify their physical properties. Machine 20 includes suitable electronic circuitry 25 constituting a scanning system for controlling a scanning servo 28 which, in this case, is mostly a scanning electromagnet 30 which generates a suitable time-varying magnetic field for deflecting the electron beam 35 transversely back and forth across the target polymeric sheet material 22.

Figure 2A:
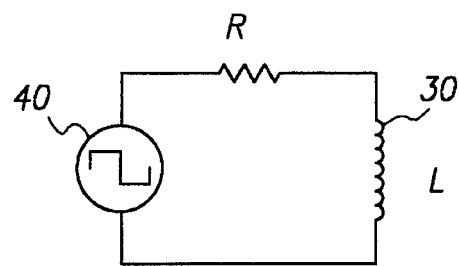
FIGS. 2a–2c illustrate the basic, conventional voltage and current relationships between the scanner control system and the beam sweep control magnet.
Figure 2B:
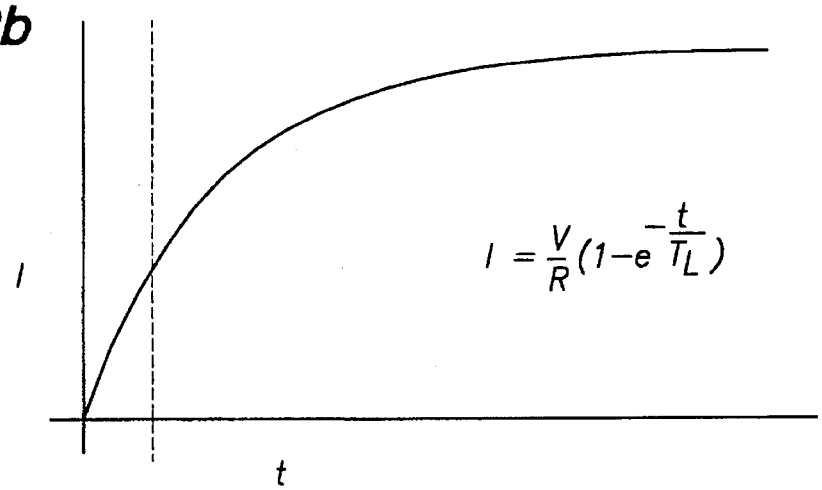
Figure 2C:
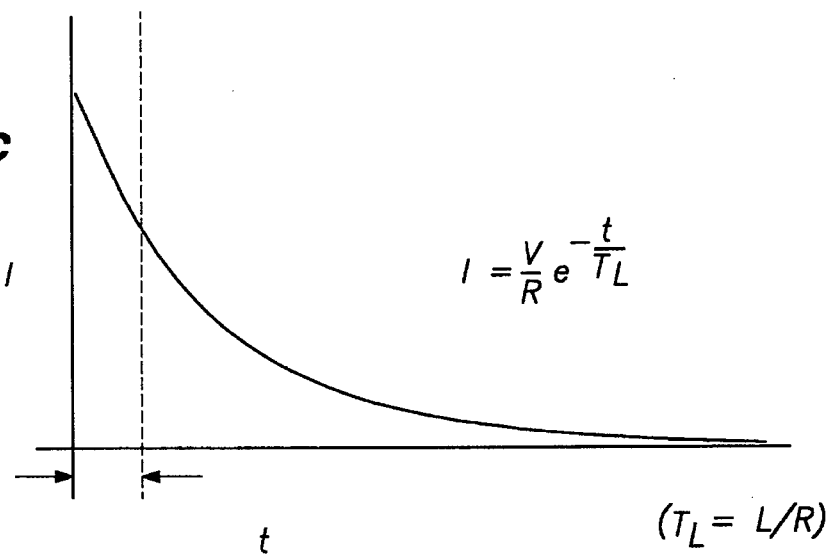

FIGS. 2a–2c illustrate a commonly employed basic approximation to linear scanning for beam scanning machines 20. This is done by applying a square wave voltage source 40 to the inductance of the scanning electromagnet 30. The applied voltage causes a rise and decay to the current in the circuit that initially changes quickly, then asymptotically approaches the upper and lower limits as may be seen respectively in FIGS. 2b and 2c. By selecting the electromagnetic coil inductance and resistance and the applied square wave voltage and frequency, it is possible to make use of the more rapidly changing, nearly linear early portions of the curves. As is well understood, therefore, the applied square wave voltage produces a triangular-shaped current wave.

Figure 3:
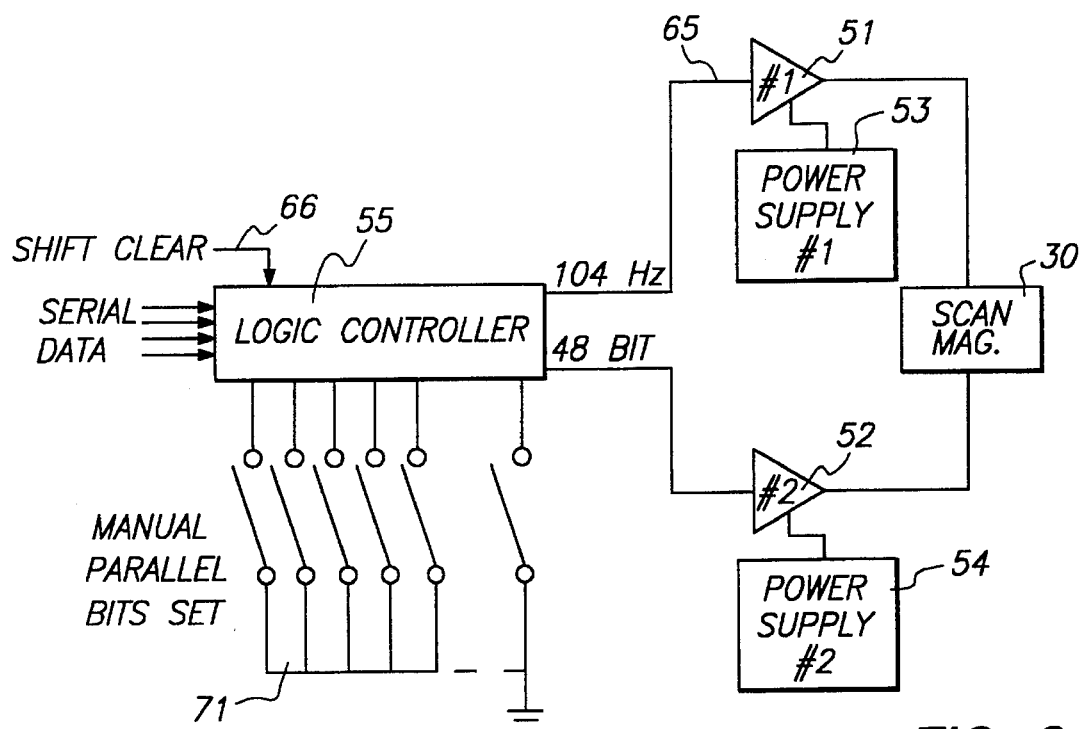
FIG. 3 is a block circuit diagram of the present invention.

FIG. 3 illustrates very diagramatically the improved scanning signal generator 50 (part of circuitry 25) of the present invention. The scanning electromagnet 30 (within scanner servo 28) is driven by two power amplifiers 51 and 52 having corresponding power supplies 53 and 54. In the preferred embodiment, the normal mode of operation has the two amplifiers 51 and 52 working together in a complimentary "push-pull" manner. However, in accordance with the present invention, while power amplifier 51 always operates in this manner, amplifier 52, on the other hand, can be rapidly switched into "reverse" (i.e., off if on, or on if off) at selected predetermined times, to reduce or enhance the slope of the corresponding portion of the current wave in magnet 30 to alter the resulting scanning behavior of the servo as a direct result thereof. If the pulse amplitudes from amplifier 52 are of the same magnitude but opposite to the steady scanning signal from power amplifier 51 during a particular cycle, the affect can even be to flatten the scan signal during that pulse. This will cause the electron beam to dwell at the corresponding location on the product 22, which means that that location will receive an increased electron radiation dose. The exact position and length of time where the beam will thus dwell is controlled by the logic control circuit 55 and by the amplitudes of the power supplies 53 and 54 of the two amplifiers.

Figure 4:
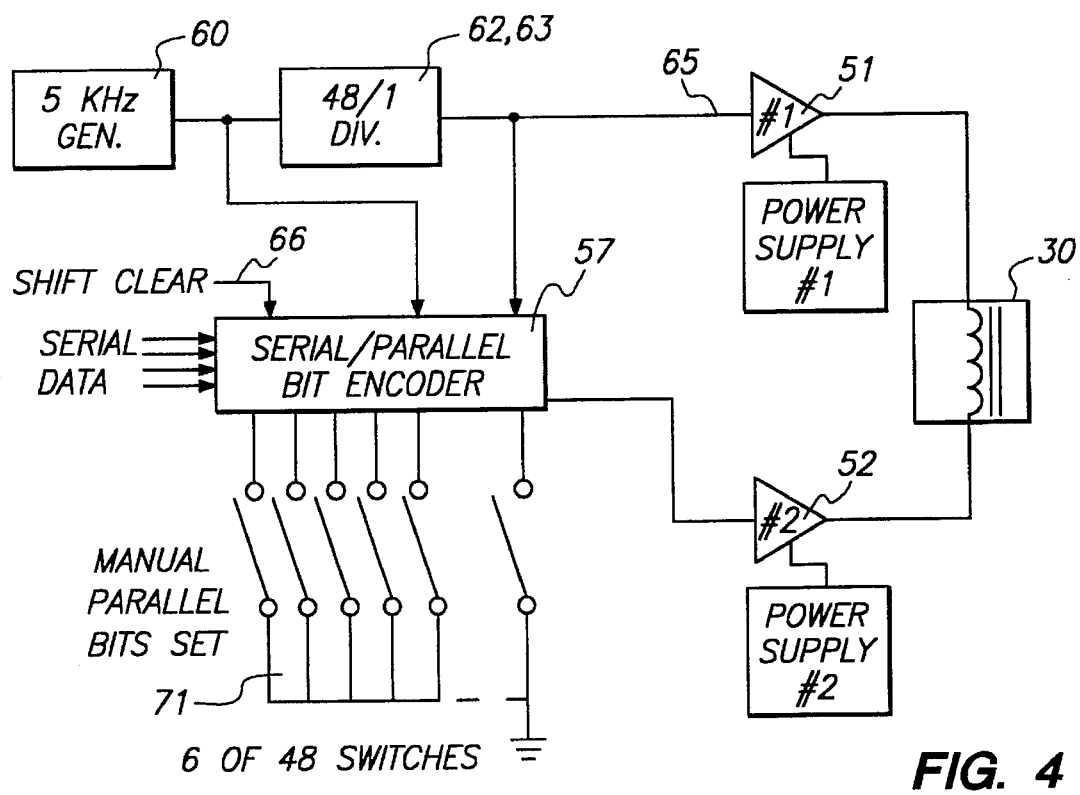
FIG. 4 is a block circuit diagram illustrating the bit encoder in the FIG. 3 circuit.

FIG. 4 illustrates some additional circuit details including the bit encoder or bit pulse signal generator 57, the manual switches 71 of which can be set to preselect the pulse pattern from the pulse signal generator to achieve the desired resulting scanning behavior of the servo. Depending upon how the individual bits for amplifier 52 are set in bit encoder 57, the magnet current due to the drive of amplifier 51 can either be enhanced or diminished, as a result of the bucking/ summing currents of amplifier 52. It thus becomes a straightforward matter to tailor the beam dose to a given set of requirements.

Figure 5:
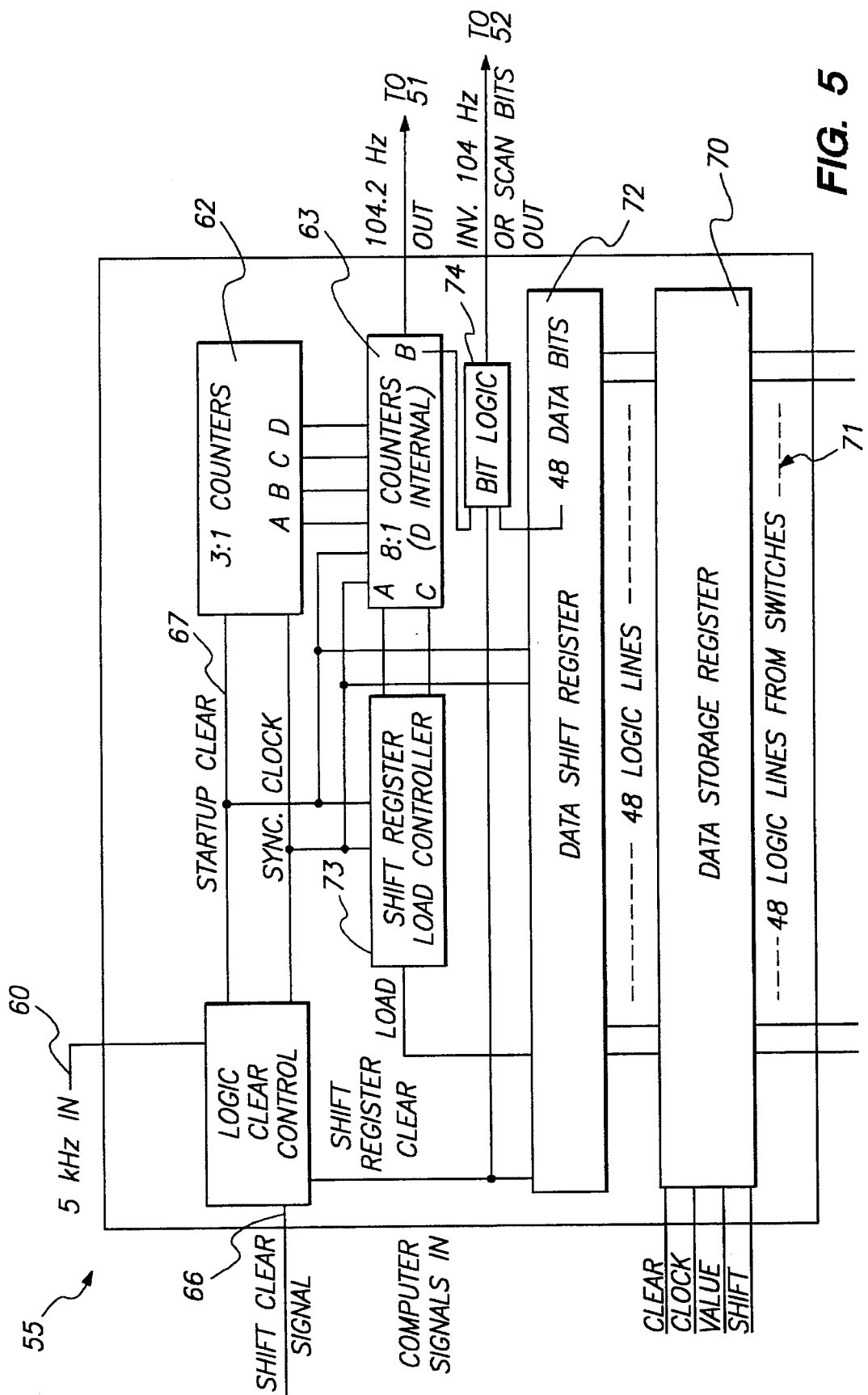
FIG. 5 is a block circuit diagram of the logic controller circuit in FIG. 3.
Figure 6:
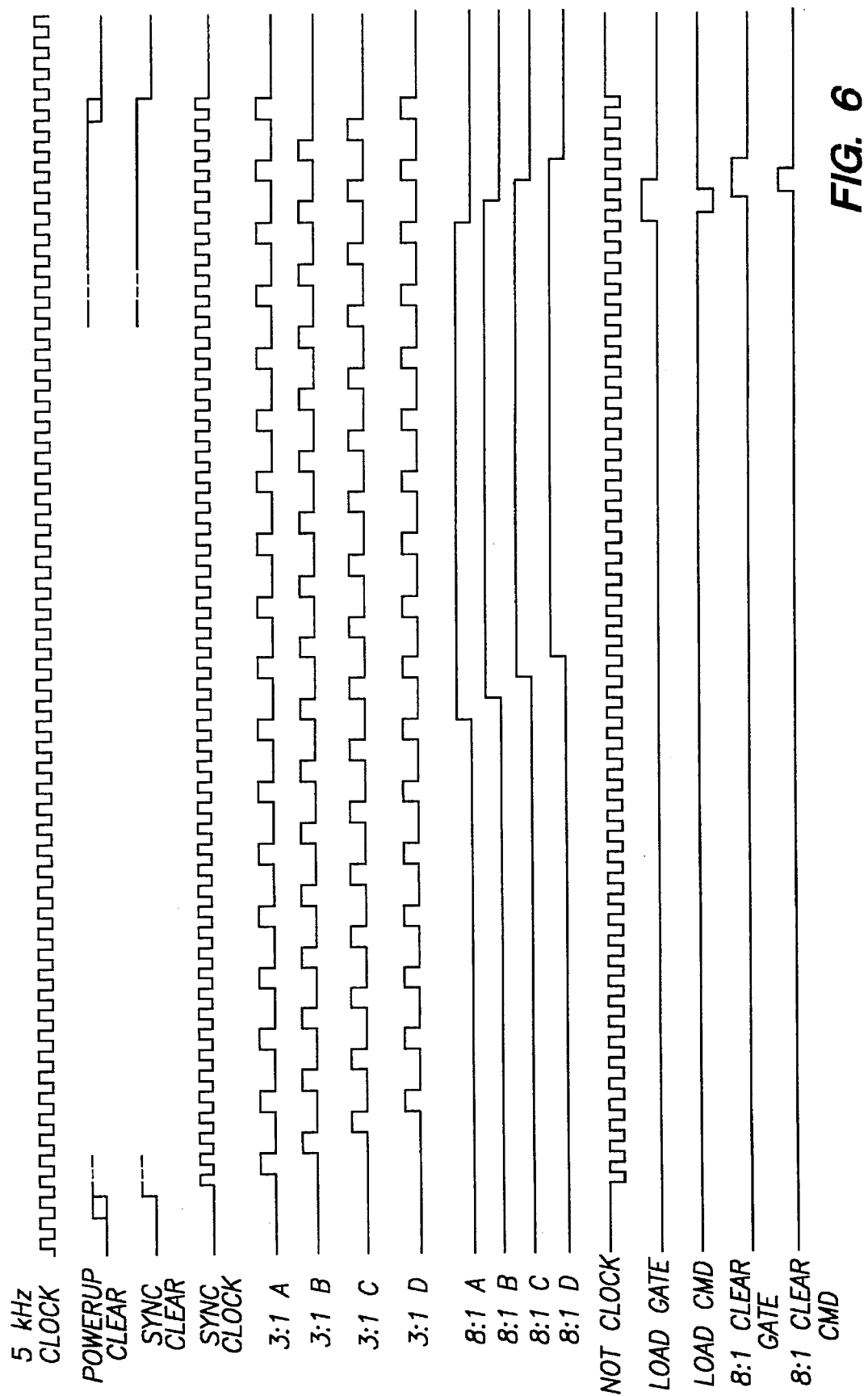
FIG. 6 is a diagram showing the logic controller circuit timing.

Referring to FIG. 5, the block diagram of the circuit 55 shows that a 5 kHz signal 60 is externally supplied to the circuit. This signal could alternatively be generated within the circuit by an on-board oscillator. The 5 kHz signal is then divided by 48 in two stages, using 3:1 counter 62 and 8:1 counter 63. The resulting 104 Hz signal is fed to power amplifier 51. If the shift clear signal 66 from the computer (not shown) is asserted, then the inverse of the 104 Hz signal is fed to power amplifier 52. The 3:1 and 8:1 counters 62 and 63 run continuously when the circuit is powered, after a brief startup clear signal 67 is asserted to clear all of the logic. The startup clear signal 67 and the 5 kHz clock are also used to produce a synchronized clock, insuring that the circuit will receive only full clock pulses. The control computer asynchronously loads a set of data storage registers 70, either serially from the computer, or in parallel from a set of 48 switches 71 which may be operated manually. When an operator requests the control computer to begin selective scanning, the shift clear signal 66 to the data shift registers 72 is released. Under the control of the shift register load controller 73, the data shift registers 72 load the 48 bit pattern from the data storage registers 70, and serially send the 48 bits to power amplifier 52. Other sets of 3:1 and 8:1 counters may be used to control the loading of data to keep the bit pattern in synchrony with the 104 Hz square wave. FIG. 6 shows the timing diagram for this circuit.

Figure 7:
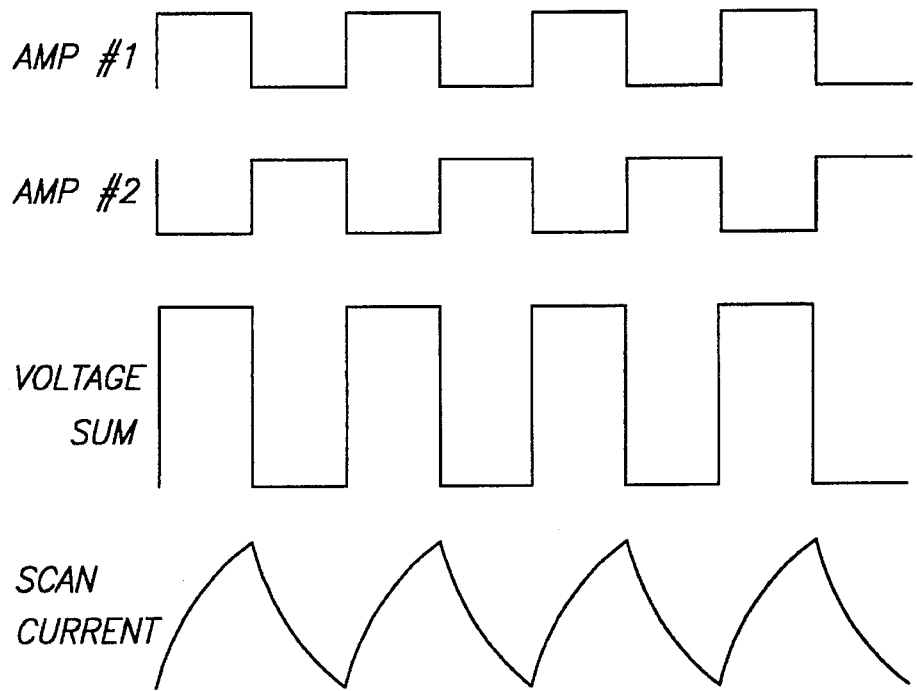
FIG. 7 shows diagrammatically the applied voltages and resulting scan magnet currents in a typical linear electron beam scanning system.
Figure 8:
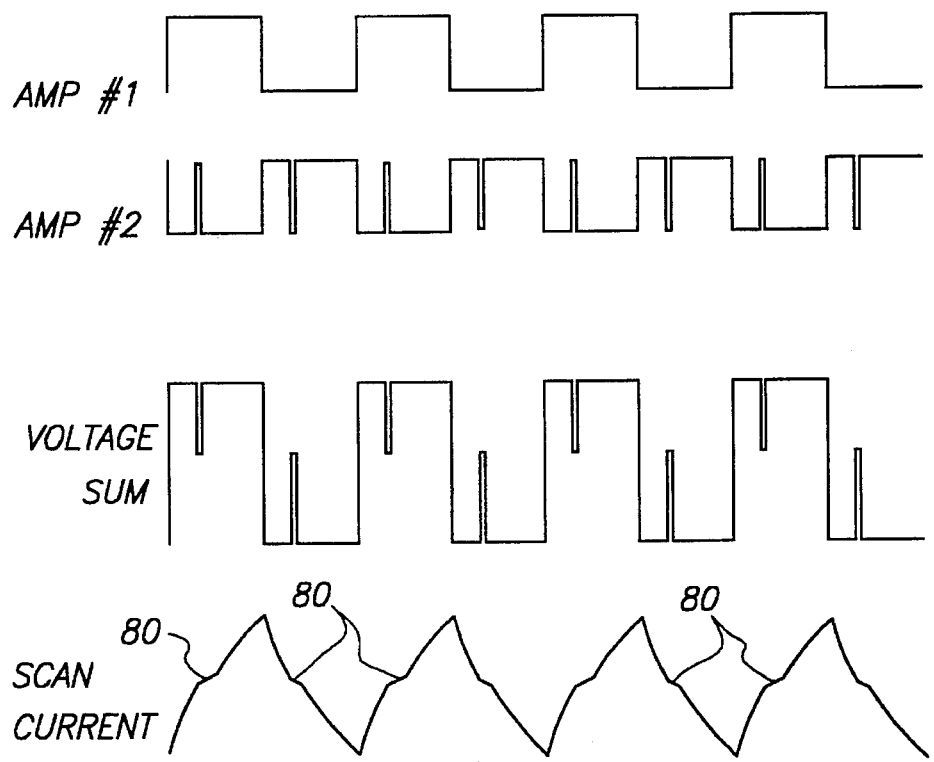
FIG. 8 shows diagrammatically the modified applied voltages and resulting scan magnet currents in an electron beam scanning system operated in one configuration according to the present invention.

As should now be clear, the two power amplifiers 51 and 52 have two modes of operation. In the normal mode, they work together in a complimentary "push-pull" arrangement. However, during the time interval represented by a "set" bit in the 48 bit pattern, power amplifier 52 works against amplifier 51. Depending upon the voltage output of power amplifier 52, the slope of the corresponding portion of the current wave shape will be reduced, possibly even to flat or with reversed slope. During this time, the electron beam will dwell at the corresponding location on the product, increasing its radiation dose. This is illustrated in FIGS. 7 and 8. FIG. 7 shows the "normal" mode of operation in which no bits are set. FIG. 8 illustrates two bits set, one for each half of the square wave cycle. The top curve in each figure represents the output of power amplifier 51, the second curve from the top is the output from power amplifier 52, the third curve is the resulting voltage across the scanning electromagnet 30, and the bottom curve is the current in the scanning electromagnet. Of course, since the current in the electromagnet 30 produces the deflection magnetic field which sweeps the beam, the beam position correlates directly with the magnitude of this current. The "ledges" 80, therefore, in the bottom curve of FIG. 8 are thus stationary events in the sweeping of the electron beam, causing increased exposure of the target material 22 in those regions.

It is interesting to note that the electrodynamics of the scanning system cause the "ledges" 80 where the electron beam lingers to "rob" the scanning electromagnet 30 of its peak current. That is, all else being equal, the maximum current excursions (bottom trace) in the scanning magnet in FIG. 7 will be greater than those in FIG. 8. This occurs because, when the power amplifier 52, as operated in FIG. 8, returns to normal operation, the current resumes its climb at only the same original slope. However, because time has been lost in this cycle while the beam lingered during the "bit on" portion of the cycle, the square wave will reverse at the expiration of the cycle period, preventing the current in the scanning electromagnet from reaching the maximum that it would have had the power amplifier 52 not interrupted the beam sweep. In other words, the current never has a chance to "catch up" with the level it would have had in FIG. 7. What this means, of course, is that the power supplies 53 and 54 need to be adjusted to deliver higher driving power or voltage to the amplifiers 51 and 52 as more and more bits are turned on to customize the sweep pattern in order to maintain a full sweep of the beam all the way across the target. It will also occur to those skilled in the art that increasing the driving voltage will steepen the slope of the current curve, increasing the sweep speed and slightly reducing the beam exposure in those portions of the target material in which the bits are "off". Again, this is easily compensated by adjusting the electron flux and/or the speed at which the material 22 is transported past the scanning area in the beam scanning machine 20.

Figure 9:
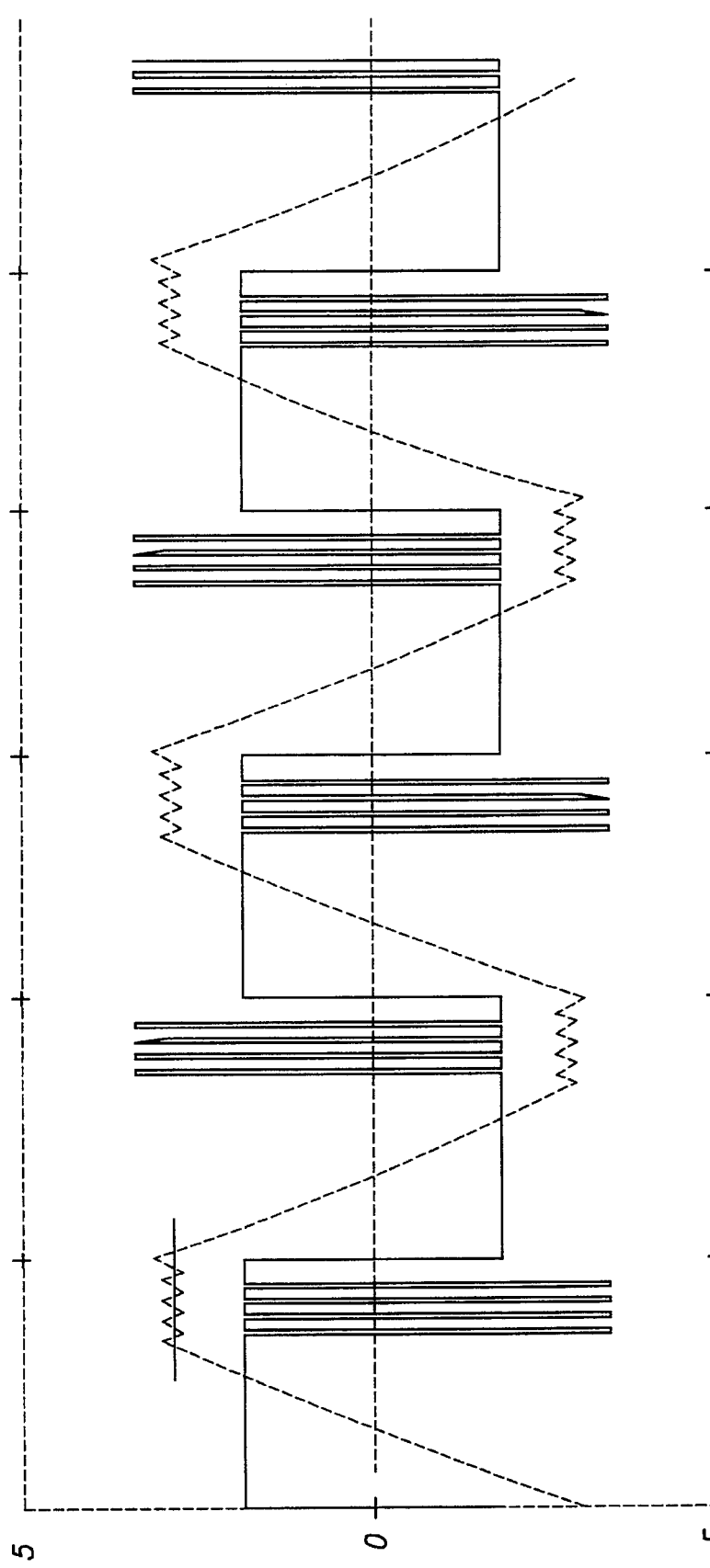
FIG. 9 is a graphical computer simulation of voltages and currents in another configuration more complex than the one illustrated in FIG. 8, and suited to provide enhanced edge beaming of sheet target material.

FIG. 9 is a computer simulation of a bit pattern in which 8 bits are turned on, four for each half of the square wave scan signal, the bits having been selected to cause the beam to linger at the edges of the scanning pattern to increase the beam dosage at the edges of the target material.

Figure 10:
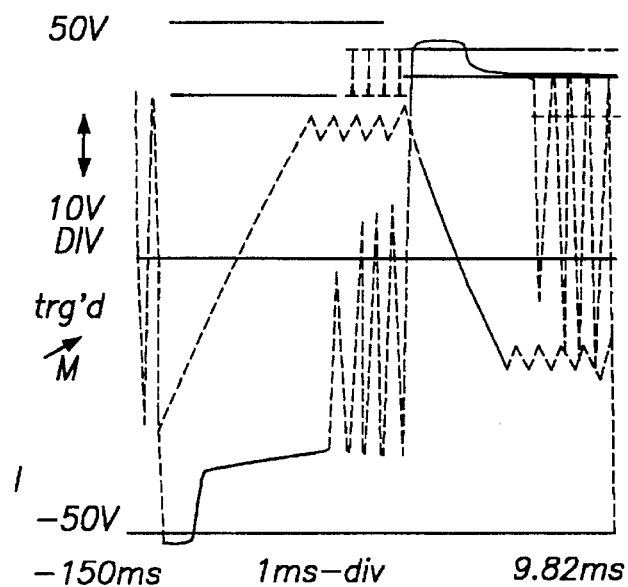
FIG. 10 shows actual applied scan signals, pulse signals, and resulting scan magnet currents in an electron beam scanning system according to the present invention operated similarly to the calculated configuration illustrated in FIG. 9.

FIG. 10 shows traces of the voltage and current for a configuration similar to that in FIG. 9, the bits in FIG. 10 which are turned on being bits 17, 19, 21, 23, 41, 43, 45, and 47 out of the 48 bit switches 71, or, in the preferred embodiment, the corresponding serial data bits from the computer.

Figure 11:
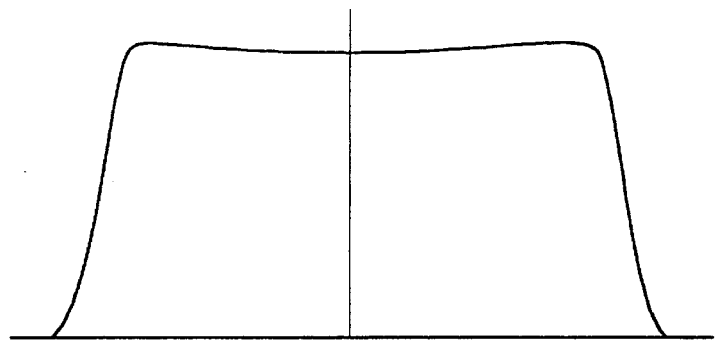
FIG. 11 shows typical electron beam scan dose versus transverse position for sheet material beamed by an unmodifed linear scanning signal such as illustrated in FIG. 7.

FIG. 11 illustrates a normal scan dose profile resulting from a scan pattern in which all of the bits are turned off.

Figure 12:
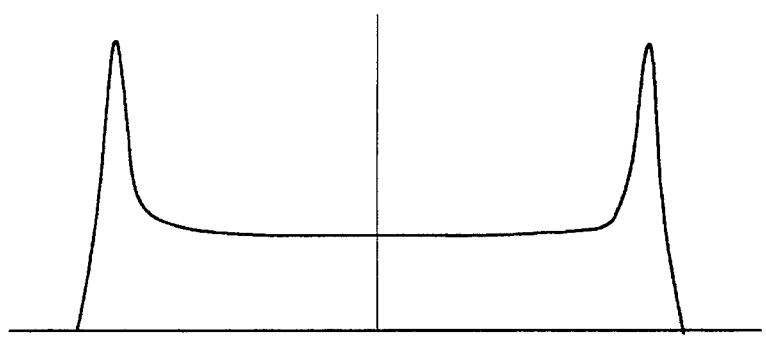
FIG. 12 is an illustration similar to FIG. 11 showing scan dose versus transverse position for an edge-dose enhancing scanning signal of the present invention, such as illustrated in FIGS. 9 or 10.

FIG. 12 illustrates the dose profile for target material in which the edge exposure has been enhanced by a bit pattern such as illustrated in FIG. 9 or FIG. 10.

As may be seen, therefore, the present invention provides numerous advantages. Principally, it provides a significantly improved and effective scanning control system for providing highly sophisticated control of a scanner servo. The present invention, however, can be implemented efficiently and inexpensively, without the need for expensive variable output power amplifiers, for example. With the present invention, power amplifier 51 can be operated simply full on or full off. Specific higher and lower modulations of the sweep pattern can then be achieved by the separately imposed pulses from power amplifier 52. The only variables which need to be applied to the power amplifiers are time variables, not amplitude. As indicated, this provides a great deal of sophisticated control by means of a very simple, straightforward circuit. An additional advantage is that the scanning circuitry 25 does not itself have to include electronic means for summing and rationalizing the several outputs from the power amplifiers 51 and 52 themselves. Instead, the outputs from the power amplifiers are separately and respectively applied directly to the scanner servo, in this case the scanning electromagnet 30. Then, the physical nature of the scanning electromagnet (i.e., it's inherent inductance) causes it to sum the signals from the power amplifiers, as they are applied to the opposite coil terminals of the scanning electromagnet 30, such that the resulting scanning behavior of the scanning electromagnet servo corresponds to the scan signals from power amplifier 51 modified by the pattern of pulses from power amplifier 52.

Another very important advantage of the present invention is that the differential beam exposure of the target material 22 can be achieved from a substantially constant electron beam current in the beam scanning machine 20. Modulating the beam current is not always an easy task and preferably is avoided. Thus, the present invention also eliminates the need for expensive beam intensity modulation capability. This also improves the overall efficiency and throughput of the invention because the full beam capacity can be continuously utilized for processing the target material.

Of course, various modifications to the present invention will occur to those skilled in the art upon reading the present disclosure. For example, power amplifier 52 can be designed to be operated so that the pulses can be bipolar to buck or to enhance the current from power amplifier 51, or variations thereon as desired, to steepen the current curve in the scanning electromagnet as well as to flatten it, if desired.

In another variation, a single scan amplifier 51 could be used by pulse width modulation of the scan modifying pulses. Modifications to the logic circuit 55 would be required to accomplish this. Such an embodiment would reduce the flexibility inherent in the two scan amplifier approach, however.

Claim dependencies have been drafted to comply with PCT Rule 6.4, but it will be understood that, at least by virtue of this paragraph, any appropriate combination of the features disclosed and/or claimed herein is in itself an embodiment of the invention, and it is intended to use multiple dependent claims in the national phase where permitted.

Therefore, while the methods and forms of apparatus herein described constitute preferred embodiments of this invention, it is to be understood that the invention is not limited to these precise methods and forms of apparatus, and that changes may be made therein without departing from the scope of the invention.

What is claimed is:

1. A scanning system for controlling a scanner servo, comprising:
    a) a scanning signal generator for generating a predetermined series of scan signals,
    b) a pulse signal generator for generating a predetermined pattern of pulses having pulse durations substantially less than the duration of a scan signal from said scanning signal generator,
    c) means for substantially synchronizing said pulse signal generator with said scanning signal generator, and
    d) means for applying said scan signals and separately applying said pulses to such a scanner servo to control it such that the resulting scanning behavior of the servo corresponds to said scan signals modified by said pattern of pulses.

2. The scanning system of claim 1 wherein said scanning signal generator generates substantially square wave scan signals.

3. The scanning system of claim 1 wherein said scanning signal generator generates a substantially cyclical series of scan signals.

4. The scanning system of claim 1 wherein said pulse signal generator further comprises means for controlling at least one of the duration, amplitude, number, and/or timing of said pulses.

5. The scanning system of claim 4 wherein said pulse signal generator further comprises a bit pulse generator means for controlling said pulses.

6. The scanning system of claim 1 further comprising a scanner servo for controlling the sweeping of an electron beam during electron beam scanning, said scanner servo being controlled by said means for applying said scan signals and said pulses to control said electron beam sweeping in response thereto.

7. The scanning system of claim 6 wherein:
    said scanner servo further comprises a scanning electromagnet, and
    said means for applying is connected to coil means of said electromagnet to apply said scan signals to one portion of said coil means and to apply said pulses to another portion of said coil means, such that said scanning electromagnet physically combines said scan signals and said pulses to yield said resulting scanning behavior.

8. The scanning system of claim 7 wherein said means for applying is connected to opposite coil terminals of said scanning electromagnet to apply said scan signals to one of said terminals and said pulses to the other.

9. The scanning system of claim 6 wherein said pulse signal generator further comprises scan dose control means for said electron beam scanning to provide controllable differential beam dosage as a function of said scan signals modified by said pulses.

10. The scanning system of claim 9 wherein said scan dose control means further comprises means for generating a predetermined differential beam exposure from a substantially constant beam current.

11. A scanning system for controlling a scanner servo, comprising:
    a) a scanning signal generator for generating a predetermined series of cyclical square wave scan signals,
    b) a pulse signal generator for generating a predetermined pattern of pulses having pulse durations substantially less than the duration of a scan signal from said scanning signal generator,
    c) a bit pulse generator means incorporated in said pulse signal generator for controlling at least one of the duration, amplitude, number, and/or timing of said pulses,
    d) means for synchronizing said pulse signal generator with said scanning signal generator,
    e) a scanner servo including a scanning electromagnet for controlling the sweeping of an electron beam during electron beam scanning,
    f) means for applying said scan signals and separately applying said pulses to said scanner servo to control it and said electron beam sweeping such that the resulting scanning behavior of said servo corresponds to said scan signals modified by said pattern of pulses, said means for applying being connected to opposite coil terminals of said scanning electromagnet to apply said scan signals to one of said terminals and said pulses to the other, such that said scanning electromagnet physically combines said scan signals and said pulses to yield said resulting scanning behavior, and
    g) said pulse signal generator including scan dose control means for said electron beam scanning to provide, from a substantially constant beam current, controllable differential beam dosage as a function of said modified scan signals.

12. A method for controlling a scanner servo, comprising the steps of:
    a) generating a predetermined series of scan signals in a scanning signal generator,
    b) generating a predetermined pattern of pulses in a pulse signal generator, the pulses having pulse durations substantially less than the duration of a scan signal from the scanning signal generator,
    c) substantially synchronizing the pulse signal generator with the scanning signal generator, and
    d) applying the scan signals and separately applying the pulses to such a scanner servo to control it such that the resulting scanning behavior of the servo corresponds to the scan signals modified by the pattern of pulses.

13. The method of claim 12 further comprising the step of generating substantially square wave scan signals.

14. The method of claim 12 further comprising the step of generating a substantially cyclical series of scan signals.

15. The method of claim 12 further comprising the step of controlling at least one of the duration, amplitude, number, and/or timing of the pulses.

16. The method of claim 15 further comprising the step of controlling the pulses with a bit pulse generator.

17. The method of claim 12 further comprising the step of controlling the sweeping of an electron beam during electron beam scanning with a scanner servo, the scanner servo being controlled by said applying of the scan signals and the pulses, to control the electron beam sweeping in response thereto.

18. The method of claim 17 wherein:

the scanner servo further comprises a scanning electromagnet, and said applying step further comprises the step of applying the scan signals to one portion of coil means of the electromagnet and applying the pulses to another portion of the coil means, such that the scanning electromagnet physically combines the scan signals and the pulses to yield the resulting scanning behavior.

19. The method of claim 18 further comprising the step of applying the scan signals to one of the coil terminals of the scanning electromagnet and applying the pulses to the opposite coil terminal.

20. The method of claim 17 further comprising the step of providing controllable differential beam dosage as a function of the scan signals modified by the pulses.

21. The method of claim 20 further comprising the step of generating a predetermined differential beam exposure from a substantially constant beam current.

22. A method for controlling a scanner servo, comprising the steps of:

a) generating a predetermined series of cyclical square wave scan signals in a scanning signal generator, b) generating a predetermined pattern of pulses in a pulse signal generator, the pulses having durations substantially less than the duration of a scan signal from the scanning signal generator, c) controlling at least one of the duration, amplitude, number, and/or timing of the pulses with a bit pulse generator means incorporated in the pulse signal generator, d) synchronizing the pulse signal generator with the scanning signal generator, e) controlling the sweeping of an electron beam, during electron beam scanning, with a scanner servo including a scanning electromagnet, f) applying the scan signals and separately applying the pulses to the scanner servo to control it and the electron beam sweeping by applying the scan signals to one of coil terminals of the scanning electromagnet and applying the pulses to the opposite coil terminal, such that the scanning electromagnet physically combines the scan signals and the pulses to produce resulting scanning behavior of the servo which corresponds to the scan signals modified by the pattern of pulses, and g) generating, from a substantially constant beam current, a controllable differential beam dosage as a function of the scan signals modified by the pulses.

* * * * *